United States Patent [19]

Sachdev et al.

[11] Patent Number: 5,399,462
[45] Date of Patent: Mar. 21, 1995

[54] METHOD OF FORMING SUB-HALF MICRON PATTERNS WITH OPTICAL LITHOGRAPHY USING BILAYER RESIST COMPOSITIONS COMPRISING A PHOTOSENSITIVE POLYSILSESQUIOXANE

[75] Inventors: Krishna G. Sachdev, Hopewell Junction; Premlatha Jagannathan, Patterson; Robert N. Lang, Pleasant Valley; Harbans S. Sachdev, Hopewell Junction; Ratnam Sooriyakumaran, Fishkill; Joel R. Whitaker, Port Ewen, all of N.Y.

[73] Assignee: International Business Machines Corporation, Armonk, N.Y.

[21] Appl. No.: 274,571

[22] Filed: Jul. 13, 1994

Related U.S. Application Data

[63] Continuation of Ser. No. 968,773, Oct. 30, 1992, abandoned.

[51] Int. Cl.⁶ .............................. G03F 7/30; G03F 7/36; G03F 7/023
[52] U.S. Cl. ............................ 430/323; 430/166; 430/190; 430/193; 430/313; 430/317; 430/326
[58] Field of Search .............. 430/172, 314, 316, 317, 430/166, 190, 313, 323, 326

[56] References Cited

U.S. PATENT DOCUMENTS

| | | | |
|---|---|---|---|
| 4,395,527 | 7/1983 | Berger | 430/190 |
| 4,722,881 | 2/1988 | Ueno et al. | 430/166 |
| 4,745,045 | 5/1988 | Fredericks et al. | 430/166 |
| 4,745,169 | 5/1988 | Sugiyama et al. | 528/43 |
| 5,087,553 | 2/1992 | Adachi et al. | 430/317 |

FOREIGN PATENT DOCUMENTS

| | | |
|---|---|---|
| 0147127 | 11/1984 | European Pat. Off. . |
| 0229629 | 7/1987 | European Pat. Off. . |
| 0365881 | 4/1989 | European Pat. Off. . |
| 58-48045 | 3/1983 | Japan ................. 430/190 |
| 62-212645 | 9/1987 | Japan ................. 430/190 |
| 1222254 | 5/1989 | Japan . |
| 2-32354 | 2/1990 | Japan ................. 430/190 |

OTHER PUBLICATIONS

J. F. W. McOmie and M. L. Watts, "Boron Tribromide-A Powerful Demethylating Reagent For Aromatic Ethers", Chem Ind. 1963, P1658-EOA.

J. F. W. McOmie and M. L. Watts, "Demethylation of Aryl Methyl Ethers by Boron Tribromide", Tetrahedron V24, 1968, P2289-EOA.

G. J. Hefferon, et al, "Method For Synthesis of Alkali Soluble Silsesquioxane Polymers", IBM T.D.B. V34, No. 4B, Sep. 1991.

A. Tanaka, et al., Journal of Vacuum Science & Technology B7, "Resolution Characteristics of a Novel Silicone-based Positive Photoresist", May/Jun., 1989, No. 3, New York.

*Primary Examiner*—Charles L. Bowers, Jr.
*Assistant Examiner*—John S. Chu
*Attorney, Agent, or Firm*—Dale M. Crockatt

[57] ABSTRACT

A method is provided for forming a microlithographic relief image having a width of less than one half micron in a bilayer resist composition. The resist composition comprises a single component, silicon-containing photoimageable layer and a polymeric underlayer having a high optical density and a refractive index similar to the refractive index of the overlaying resist. The method provides for the formation of a relief image in the top layer using an i-line (365 nm) or deep ultra violet (170 to 300 nm) light source, followed by $O_2$ RIE transfer of the relief image into the polymeric underlayer.

11 Claims, No Drawings

METHOD OF FORMING SUB-HALF MICRON PATTERNS WITH OPTICAL LITHOGRAPHY USING BILAYER RESIST COMPOSITIONS COMPRISING A PHOTOSENSITIVE POLYSILSESQUIOXANE

The application is a continuation of application Ser. No. 07/968,773, filed Oct. 30, 1992, now abandoned.

FIELD OF INVENTION

This invention relates to methods for making microlithographic patterns having dimensions of less than 0.5 μm with mid and deep UV radiation by using resist compositions comprising benzylsilsesquioxane resins having diazonaphthoquinone sulfonyloxy groups covalently bonded thereto. The invention further relates to bilayer lithographic processes using such compositions as etch barrier masks for the transfer of sub-half micron features into polymer underlayers during very large scale integration (VLSI) and ultra large scale integration (ULSI) semiconductor device fabrication.

BACKGROUND ART

In the fabrication of very large scale integrated (VLSI) circuits and ultra large scale integrated (ULSI) circuits, resist materials and lithographic processes which may be used for the high throughput manufacturing of sub-half micron feature sized devices are desirable. Positive working, aqueous base developable, single layer photoresists based on acid amplification, and lithographic processes for their use, are well known. In lithographic processes where a short wavelength exposing light source is used in conjunction with a lens having a high numerical aperture, acid amplified single layer resists can provide sub-half micron resolution. However, the depth-of-focus of exposure tools at such wavelengths is limited. In addition, acid amplified deep UV (DUV) resists often exhibit high sensitivity to environmental contaminants and require special procedures for handling or storing resist materials.

An improvement of the present invention over the single layer resist approach for high resolution patterns entails a bilayer lithographic process which utilizes a relatively thin imaging layer, which typically has a thickness of 0.2 to 0.4 μm, over a 1.0 to 1.5 μm thick planarizing layer. In such a process, the top layer resist materials should satisfy certain fundamental functional requirements. These include high resolution, good image quality, high $O_2$ etch resistance for low bias after the dry etch transfer of the resist pattern into the underlayer, process reproducibility, and compatibility with clustered manufacturing for high throughput. Existing resist compositions which are not based on photogenerated acid amplification do not have the photospeed necessary for economic thruput with mercury arc DUV steppers. Such compositions also have limited usefulness with excimer laser DUV sources.

Another improvement resulting from the bilayer resist process of the present invention relates to the suppression of optical interference effects. It is generally recognized that patternwise exposure with monochromatic light over reflective surfaces or line edges often gives rise to standing waves within the resist due to interface reflections interfering with the incident light. The scattering and interference effects adversely affect the resist resolution and present a major problem in line width control which is necessary for sub-half micron dimensions. One of the most commonly used approaches to solve the problems associated with light scattering and interface reflections is to add an absorbing dye into the underlayer. However, a dye added to the underlayer is effective in reducing underlayer/substrate interface reflections, but is not effective in reducing imaging resist/underlayer interface reflections.

Thus, in addition to the above requirements for the bilayer overlaying resist, the planarizing underlayer must also have certain specific fundamental optical properties. Two important requirements for the underlayer are: (a) a high optical density at the overlaying resist exposure wavelength; (b) a refractive index which matches the refractive index of the overlaying resist layer, so as to eliminate the line width control problem which is otherwise caused by interface reflections and scattering effects.

SUMMARY OF THE INVENTION

It is an object of this invention to provide a bilayer lithographic process using optical exposure with a diazonaphthoquinone based silicon containing resist for sub-half micron applications.

Another object of this invention is to provide an improved bilayer lithographic process with a low cost, high sensitivity, environmentally stable silicon-containing resist for high thruput clustered manufacturing of VLSI and ULSI devices.

A further object of this invention is to provide a bilayer lithographic process with a new silicon-containing resist using i-line (365 μm), or excimer laser DUV or broadband DUV exposure (in the range of about 170 to 300 μm wavelength) to delineate residue-free 0.35 μm and 0.20 μm features with a vertical wall profile by $O_2$ RIE through up to 2 μm thick polymer underlayers.

Yet another object of this invention is to provide an improved bilayer resist scheme using a high contrast silicon containing resist in conjunction with a polyimide underlayer having a high optical density at the exposure wavelength and a refractive index matching that of the silicon resist.

Another object of this invention is to provide an improved bilayer lithographic scheme for the etch transfer of sub-half micron resist patterns into polymer underlayers without bias or changes in line width.

A further object of this invention is to provide a high sensitivity, high contrast silicon-containing resist having large process latitude and performance consistency in terms of resolution and residue-free transfer of the resist pattern into a polymer underlayer by $O_2$ reactive ion etching (RIE), the underlayer being easily strippable after the process cycle.

This invention also provides a bilayer lithographic process using a silicon-containing resist with g-line, (436 μm), i-line, or excimer laser DUV exposure to delineate sub-micron patterns with an undercut profile in up to 2 μm thick soluble polyimides following $O_2$ RIE for use in lift-off applications.

DETAILED DESCRIPTION

In accordance with the present invention, sub-half micron lithographic patterns may be formed using one of the photosensitive silicon-containing resist compositions selected from those provided in copending U.S. patent application Ser. No. 07/876,277, entitled "Silicon-Containing Positive Resist and Method of Using the Same in Multilayer Metal Structures," filed by Krishna G. Sachdev, et al., on Apr. 30, 1992, Attorney Docket No. FI9-91-193, the disclosure of which is incorporated by reference herein. Such compositions comprise phenolic hydroxy containing silsesquioxane polymers partially esterified with diazonaphthoquinone groups selected from the group consisting of substituted poly-[p-hydroxy-benzylsilsesquioxane-co-p-methoxybenzylsilsesquioxane-co(2-diazo-1-naphthoquinonesulfonyloxy)silsesquioxanes] represented by the formula:

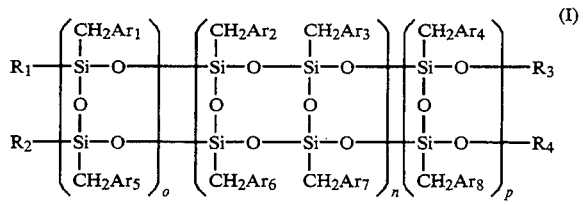
(I)

wherein (1) R is either H or $Si(CH_3)_3$, (2) Ar is independently, p-hydroxyphenyl, p-methoxyphenyl, or p-(2-diazo-1-naphthoquinonesulfonyloxy)phenyl as represented respectively by the formulas

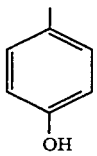
(II)

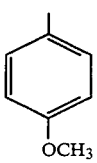
(III)

or

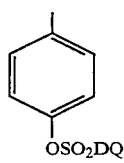
(IV)

(3) DQ is a 2-diazo-1-naphthoquinone-4 residue (4-DQ) or a 2-diazo-1-naphthoquinone-5 residue (5-DQ) as represented respectively by the formulas

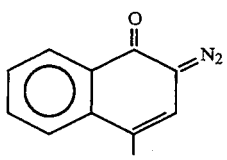
(V)

or

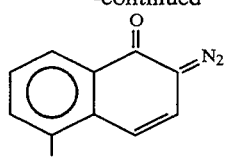
(VI)

or mixtures thereof, (4) n is an integer from 5 to 9, and o and p are, independently, 0 or 1, and (5) the molar ratio of p-hydroxyphenyl group to p-methoxyphenyl group to p-(2-diazo-1-naphthoquinonesulfonyloxy)phenyl group is in the range from 67:25:8 to 60:25:15 up to 64:30:6 to 58:30:12.

It has been unexpectedly discovered that when the relative ratio of $OH:OCH_3:OSO_2DQ$ is maintained within the narrow range, 58–67% OH, 25–30% $OCH_3$, and 6–15% $OSO_2DQ$, the bilayer resist derived therefrom is useful for the resolution of extremely small sub-micron images using mid UV radiation at relatively low exposure doses. It has also been unexpectedly discovered that when the relative ratio of $OH:OCH_3:OSO_2DQ$ is maintained within the narrow range, 58–67% OH, 25–30% $OCH_3$, and 6–12% $OSO_2DQ$, the bilayer resist derived therefrom is useful for the resolution of extremely small sub-micron images using deep UV radiation at relatively low exposure doses. When the relative proportion of methoxy groups is at the higher end of the range, that is, about 30%, then a relative proportion of $OSO_2DQ$ groups at the lower end of the range, that is, about 6–8%, is preferred. Also, the resist shows highly reproducible performance and high process latitude. Specifically, it has been observed that the resist films derived from these compositions can provide 0.25 μm resolution with i-line radiation or 0.2 μm resolution with excimer laser DUV radiation at exposure doses of less than about 15 to 20 $mJ/cm^2$. Furthermore, these high resolution patterns can be $O_2$ RIE etch transferred into various underlayers, such as baked novolak resists, soluble polyimides such as Ciba-Geigy Probimide XU9307, or DuPont RC2566 which contains the hexafluoroisopropylidene group $[>C(CF_3)_2]$ in the polyimide chain, other polyimides including low thermal coefficient of expansion (low TCE) BPDA-PDA, and other polyimide underlayers having high optical density and a refractive index matching the top resist.

According to one embodiment of the present invention, a photosensitive silicon-containing poly(p-hydroxybenzyl-silsesquioxane-co-p-methoxybenzylsilsesquioxane) is formed by reacting a 2-diazo-1-naphthoquinone-5-sulfonyl chloride, 2-diazo-1-naphthoquinone-4-sulfonyl chloride, or mixtures thereof with the phenolic hydroxy groups of a poly-(p-hydroxybenzylsilsesquioxane-co-p-methoxybenzyl silsesquioxane). The starting silsesquioxane resins and their preparation are described in the U.S. Pat. No. 4,745,169 to Sugiyama, et al. According to this invention, the starting poly-(p-hydroxybenzyl silsesquioxane-co-p-methoxybenzylsilsesquioxane) may be obtained by partial demethylation of poly-(p-methoxybenzyl silsesquioxane) using boron tribromide as described by Hefferon, et al., *IBM Technical Disclosure Bulletin*, 34, 313 (1991), instead of $(CH_3)_3SiCl$, sodium iodide, and acetonitrile as used in the Sugiyama patent. Borontribromide ($BBr_3$) mediated demethylation reactions of methoxy groups to form hydroxy groups are well known in the literature see, e.g., J. F. W. McComie and M. L. Watts, *Chem. Ind.*, 1658 (1963); J. F. W. McComie and M. L. Watts, *Tetrahedron*, 24, 2289 (1968).

For the purpose of the present invention, the starting resin poly-(p-hydroxybenzylsilesquioxane-co-p-methoxybenzyl-silsesquioxane) contains 70–75% hydroxy, and 25–30% methoxy groups. The photosensitive diazonaphthoquinone group is attached to this polymer by the reaction of 2-diazo-1-naphthoquinone-4-sulfonyl chloride with between 8 and 15 percent of the available phenolic hydroxy groups.

The 4-DQ based resist films of 3000 to 3500 Å thickness may be patterned with i-line or excimer laser DUV sources using exposure doses of less than about 20mJ/cm$^2$. Resolution of 0.25 $\mu$m is obtained with less than about five percent film thinning during development.

The 5-DQ based resist films of 3500 Å thickness may be patterned with g-line sources using exposure doses of less than about 30 mJ/cm$^2$. 0.45 $\mu$m resolution is obtained with less than about five percent film thinning during development.

In accordance with the invention, the processes for forming primary sub-half micron lithographic patterns using the silicon-containing bilayer resist composition provide the following benefits and advantages:

The resist formulations are derived from a single component polymer system which does not require the addition of photosensitizers or dissolution inhibitors.

Defect free films may be formed on silicon wafers or organic polymer layers by spin coating to thickness ranging from 1500 to 4000 Å.

The resist formulations are stable to environment requiring no special handling, storage, or processing control.

The lithographic patterns may be transferred into polymer underlayers by O$_2$ RIE without residue formation and with virtually no loss of image definition. Polymer underlayers suitable for the transfer etching of sub-half micron patterns of the silicon-containing resist include hard baked novolak-diazonaphthoquinone based resists including known, commercially available compositions, polyimide dielectrics such as BPDA-PDA, or soluble polyimides as Ciba-Geigy 287, or DuPont RC2566.

According to the preferred embodiments of this invention, the underlayer has a high optical density, in the range of about 1.0 to 2.0/$\mu$m at the wavelength used for imagewise exposure of the top resist. Also, the refractive index is similar to the refractive index of the resist, which is 1.59. These properties are useful for the suppression of optical interference effects and are an improvement over the known art.

Previously known solutions based on dye addition to a matrix resin have several disadvantages. The dye may be incompatible with the polymer matrix which results in a phase separation and poor film quality. Poor thermal stability of the dye causes decomposition or sublimation during soft bake and loss of absorption characteristics. Poor solubility of the dye in the casting solvent may cause the dye to crystallize out of solution upon storage.

Another application of the bilayer resist is in the patterning of relatively thick polyimide or other interlayer dielectric or passivation layers at the terminal via level of wafers to be diced into discrete chips. In the usual dicing operation, the slicing process tends to not cleanly cut the polymer at the edges because of its elasticity and flexibility. The operation often causes delamination of the polymer or the multilayer structures. The present bilayer resist composition may be advantageously used as a 2 $\mu$m thick resist layer to be coated on a wafer which has a 6 to 10 $\mu$m thick passivation top layer of 400° C. cured BPDA-PDA low TCE polyimide. After imaging the resist with i-line, broad band, g-line, or mid-UV radiation to form a kerf pattern having imaged lines of up to 40 to 50 $\mu$m width, the pattern is developed. The underlying polyimide may then be etched using O$_2$ RIE. The RIE may be continued later into the SiO$_2$ to about 2 $\mu$m by changing the gas mixture to CF$_4$/O$_2$ or essentially pure CF$_4$ until the resist has been completely etched. When this operation is followed by a standard dicing using a diamond saw, it yields cleanly cut chips having high integrity. According to the preferred embodiments of this invention, the underlayer polymer used for bilayer resist application has the following unique characteristics:

(a) The relevant chromophore for absorption at the resist exposure wavelength (i-line, 365 nm) is an integral part of the polymer structure and is not an additive as in the prior art.

(b) The underlayer polymer has a high thermal stability, which is greater than 200° C., and maintains the necessary absorption properties even after the high temperature bake, (c) Optical density of the cured film is greater than 1/$\mu$m at 365 nm, (d) The refractive index of the underlayer is about 1.58 to 1.62, which is similar to that of the resist, which is 1.59 to 1.60.

(e) The underlayer is readily strippable by solvent after processing.

It has been found that these properties can be achieved with polyimide having the general structures IX and X having an azobenzene (Ar—N=N—Ar) linkage in the polyimide chain structure. The polyimides are formed from the corresponding polyamic acid or polyamic ester precursors shown by the representative structures VII and VIII, which are synthesized according to standard condensation polymerization reaction of aromatic diamines with aromatic or aliphatic dianhydrides in high boiling non-reactive solvents such as N-methylpyrrolidone (NMP), Diglyme, gamma-butyrolactone, dimethylsulfoxide, and methoxy-2-propanol.

Typical dianhydrides and diamines for the preferred polyimide underlayers according to this invention include 2,2'-bis-(3,4-dicarboxyphenyl)-hexafluoropropane anhydride (6FDA); 5-(2,5-dioxotetrahydrol)-3-methyl-3-cyclohexene-1,2-dicarboxylic anhydride (B4400); 4,4'-oxydiphthalic anhydride (ODPA), and 4,4'-oxydianiline (ODA) or its 3,4' and 3,3' isomers; 4,4'-Azodianiline (ADA); 1,3-bis-(3-aminophenoxy) benezene (APB).

The following structures are provided as representative examples of the preferred chemistry of the underlayer polymers suitable for the purpose of this invention.

Structure VII - 6FDA/ADA/ODA Polyamic Acid
6FDA/4,4'-Azodianiline/4,4'-Oxydianiline

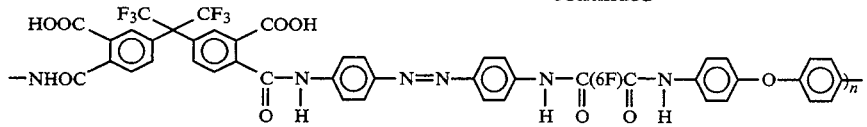

Structure VIII - B4400/ADA/APB Polyamic Acid
B4400/4,4'-Azodianiline/3,3'-Aminophenoxybenzene

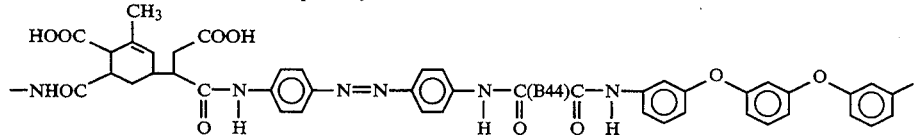

Structure IX - 6FDA/ADA/ODA Polyimide, which has a RI of 1.598

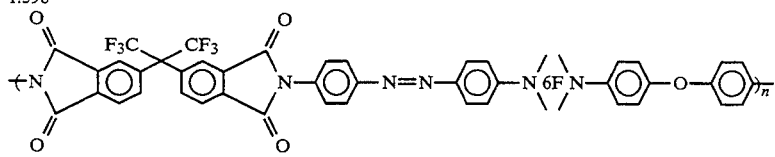

Structure X - B4400/ADA/APB Polyimide, which has a RI of 1.580

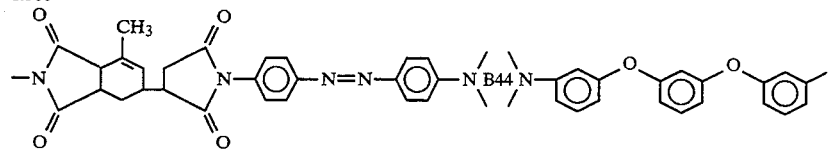

Table 1-Comparison of UV absorption characteristics and refractive indices of the polyimide underlayers and the diazonaphthoquinone-novolak based hard baked underlayer.

| Underlayer | Refractive Index | Thickness ($\mu m$) | OD at 365 nm (per 1 $\mu m$) |
|---|---|---|---|
| Baked novolak resist | 1.678 | 1.16 pm | 0.3 |
| Polyimides | | | |
| 6FDA/ADA-ODA | 1.598 | 1.03 | 2.1 |
| B4400/ADA | 1.62 | 2.03 | |
| B4400/ADA-APB | 1.58 | 1.34 | 1.9 |
| B4400/ADA-MDA | 1.61 | 1.07 | 2.0 |
| 6FDA-B4400/ADA-ODA | 1.605 | 1.10 | 2.0 |

The following examples illustrate the preferred mode of practicing this invention.

EXAMPLE 1

Poly(p-hydroxysilsesquioxane-co-p-methoxybenzyl-silsesquioxane) having OH and OCH$_3$ groups in the ratio of 75:25 was prepared by the demethylation of poly-(p-methoxybenzylsilsesquioxane) with borontribromide (BBr$_3$). A three-neck flask equipped with an addition funnel, reflux condenser, and mechanical stirrer, was charged with 450 ml dichloromethane and 100 g (0.63 mole) of poly(p-methoxybenzylsilsequioxane). The mixture was stirred at room temperature under argon to dissolve all the solids and then the flask was cooled in a dry-ice/acetone bath ($-78°$ C.). Reagent grade BBr$_3$, 44.5 ml (0.473 mole) was added dropwise under argon atmosphere with gentle stirring. After complete addition of BBr$_3$, the cooling bath was removed and the reaction mixture was stirred for 2 hrs following which 250 ml deionized water was added slowly and thoroughly mixed. Water separated upon storage which was decanted off, and the remaining solids were dissolved in 220 ml tetrahydrofuran (THF) to which was then added 80 ml deionized water and 80 ml diethylether. Using a separatory funnel, the organic layer was removed, washed sequentially with 80 ml deionized water, then 80 ml saturated sodium chloride solution, then dried over anhydrous magnesium sulfate and filtered. Solvent was removed under vacuum on a rotary evaporator, then the concentrate was dissolved in acetone and solvents were again removed on a rotovap. Last traces of solvent and other volatiles were removed by pumping overnight under high vacuum to obtain the final product as a solid. NMR analysis was consistent with structure II, having a —OH to —OCH$_3$ ratio of 75:25, respectively. cl EXAMPLE 2 poly-[p-hydroxybenzyl-silsesquioxane-co-p-methoxybenzylsilsequioxane-co-p-(1-naphthoquinone-2-diazido-4-sufonyloxy)-benzylsilsesquioxane] having a OH:OCH$_3$:4-OSO$_2$DQ ratio of 63.5:25.0:11.5, respectively, was synthesized by the method previously disclosed. This material was prepared by the partial derivatization of the available phenolic hydroxy groups in the starting material of example 1 by a reaction with 1-naphthoquinone-2-diazido-4-sulfonyl chloride in aqueous acetone solution in the presence of sodium carbonate as described in U.S. patent application Ser. No. 07/876,277.

EXAMPLE 3 poly-[p-hydroxybenzyl-silsesquioxane-co-p-methoxybenzylsilsequioxane-co-p-(1-naphthoquinone-2-diazido-5-sufonyloxy)-benzylsilsesquioxane] having a OH:OCH$_3$:5-OSO$_2$DQ ratio of 63.0:25.0:12.0, respectively, was synthesized by the method previously disclosed. This material was prepared by the partial derivatization of the available phenolic hydroxy groups in the starting material of example 1 through reaction with 1-naphthoquinone-2-diazido-5-sulfonyl chloride in aqueous acetone solution in the presence of sodium carbonate as described in U.S. patent application Ser. No. 07/876,277.

EXAMPLE 4

A typical high sensitivity i-line resist composition is prepared by dissolving a photosensitive poly(p-hydroxybenzylsilsesquioxane-co-p-methoxyl-benzylsilsesquioxane-co-p-(2-diazo-1-naphthoquinone-4-sulfonyloxy)-benzylsilsesquioxane) having a OH:OCH$_3$:4-OSO$_2$DQ ratio of 63:25:12, respectively, to form a solution having 15% w/w solids in propylene glycol monomethylether acetate (PM-acetate). The solution was filtered through a 0.2 μm membrane filter, and spin applied at 2000 rpm for 30 sec on silicon wafers previously surface modified by exposure to hexamethyldisilazane (HMDS) vapor in Freon, then baked for 1 to 2 min on a 90° C. hot plate to produce a film having a thickness of about 3000–4000 Å. Patternwise exposure with a 0.45 NA i-line (365 um) source or excimer laser DUV source at an exposure dose of less than about 15–20 mJ/cm$^2$, followed by development with 0.18N aqueous tetramethyl ammonium hydroxide solution (TMAH) for 45–60 sec provided excellent quality images having a resolution of better than 0.35. Under these conditions, unexposed resist thinning is typically less than 5%. In alternative embodiments where the resist coating was formed on a polymer underlayer comprising hard baked novolak or polyimide for a bilayer process, the resist pattern was transferred into the underlayer by O$_2$ RIE in a single wafer etching tool to produce residue-free images with no loss in definition.

EXAMPLE 5

Similarly, the resist composition derived from the photosensitive poly(p-hydroxybenzylsilsesquioxane-co-p-methoxybenzylsilsesquioxane-co-p-(2-diazo-1-naphthoquinone-5-sulfonyloxy)benzylsilsesquioxane of example 3 was evaluated using g-line (436 um) exposure with a dose of 100 mJ/cm$^2$. Again, excellent quality patterns with 0.4–0.45 μm resolution were obtained with very little thinning during the resist development process.

EXAMPLE 6

The polyamic acid of general structure VII was synthesized as follows 4,4'-diaminoazobenzene (ADA), 2.12 g (10 mmole) and 4,4'-oxydianiline (ODA), 2.2 g (10 mmole) were dissolved in a mixture of 65 ml N-methylpyrrolidone (NMP) and 10 ml Diglyme. To this solution was added 8.88 g (20 mmole) of 2,2'-bis-(3,4-dicarboxyphenyl)-hexafluoropropane anhydride (6FDA) as a solid with stirring under dry N$_2$. The rate of addition was adjusted to maintain the reaction temperature below 35° C. After the complete addition of the dianhydride, the reaction mixture was stirred at room temperature for 6 hrs until a viscous solution of the polyamic acid was formed. This was filtered through a 1 μm membrane filter and stored in the refrigerator until use.

EXAMPLE 7

A polyimide thin film underlayer comprising the polyamic acid VII of example 6 may be prepared as follows. Silicon wafers were O$_2$ plasma cleaned and surface treated with a 0.1% solution of 3-aminopropyl triethoxysilane (A1100) in a 95:5 ethanol-water mixture. The polymer solution of example 6 was spin applied at 3000 rpm for 45 sec and baked at 85° for 15 min, then 150° for 20 min, then 230° for 30 min to form a 1.05 μm thick defect-free polyimide film having the structure shown in IX. The refractive index of this film was found to be 1.598. Similar films were formed on quartz plates for measuring UV spectra. After a 230° C. bake, the optical density (OD) at 365 nm was determined to be 2.1/μm (OD=2.1 per micron of film thickness) for the polyimide film.

EXAMPLE 8

The polyamic acid of representative structure VIII was synthesized as follows 4,4'-Diaminoazobenzene (ADA), 2.12 g (10 mmole), and 3,3'-(diaminophenoxy)-benzene (APB), 2.92 g (10 mmole) were dissolved in 65 ml methoxy-2-propanol. Aliphatic dianhydride B4400, 5.28 g (20 mmole) was added with stirring to the diamine solution under an inert atmosphere over a 10 min period such that the temperature rise did not exceed 32° C. After complete addition of the dianhydride, the reaction mixture was stirred for 6 hrs, then diluted with 10 ml of gamma-butyrolactone, and filtered through a 1 μm membrane filter.

EXAMPLE 9

A polyimide underlayer comprising the polyamic acid VIII of Example 8 was prepared as follows. Silicon wafers were O$_2$ plasma cleaned and surface treated with a 0.1% solution of 3-aminopropyl triethoxysilane (A1100) in a 95:5 ethanol-water mixture. The polymer solution of example 8 was spin applied at 3000 rpm for 45 sec and baked at 85° for 15 min, then 150° for 20 min, then 230° for 30 min to form a 1.34 μm thick defect-free polyimide film having the structure shown in X. The refractive index of this film was found to be 1.58. Similar films were formed on quartz plates for measuring UV spectra. After a 230° C. bake, the optical density (OD) at 365 nm was observed to be 1.9/μm (OD=1.9 per micron of film thickness) for the polyimide film.

EXAMPLE 10

The following illustrates a typical bilayer lithographic process with an i-line exposure source for sub-half micron pattern delineation in a hard baked novolak underlayer.

Silicon wafers were O$_2$ plasma cleaned and a coating of a diazonaphthoquinone-novolak based resist was spin applied and then baked at 230° C. to form a 1.2 μm thick underlayer. The imaging, silicon-comprising resist solution having 18% w/w solids was prepared by dissolving the photosensitive polymer of Example 2 in PM-acetate and filtering sequentially through a 1 μm membrane filter two times, a 0.45 μm filter two times, and then a 0.2 μm filter. The resist solution was spin applied at 3000 rpm for 30 to 45 sec over the hard baked novolak underlayer and baked at 90° C. for 60 sec on a hot plate to form a film having a thickness of about 0.3 nm comprising a bilayer structure.

The bilayer structure was imagewise exposed using a 0.45 NA i-line stepper at an exposure dose of about 15–20 mJ/cm$^2$. Development in 0.18N aqueous TMAH for 60 sec followed by a water rinse gave excellent quality sub-half micron resist patterns. The unexposed film thickness loss was less than about 5 percent during the development step. After drying at elevated temperature, the resist pattern was O$_2$ RIE transferred into the underlayer by means of a diode type reactive ion etch tool using 100 watts RF power, 7.5 mtorr pressure, and 40–45 sccm flow of oxygen. These conditions required about 12 to 14 min to etch through the 1.2 μm hard baked novolak underlayer. SEM micrographs of etched patterns showed 0.35–0.4 μm residue-free line and space features having a vertical wall profile.

EXAMPLE 11

The following illustrates a typical bilayer lithographic process for sub-half micron pattern delineation in a polymer underlayer having a high optical density at 365 nm and having a refractive index similar to that of the overlaying silicon comprising resist.

The 6FDA-ADA-ODA polyamic acid formulation of example 6 was spin applied at 2000 rpm for 45 sec to a previously $O_2$ plasma cleaned silicon wafer and baked as described in example 7 to form a 1.3 μm thick polyimide underlayer. The imaging, silicon-comprising resist formulation described in example 10 was then spin applied at 3000 rpm for 30 sec and baked at 90° C. on a hot plate for 60 sec.

The bilayer structure was imagewise exposed using a 0.54NA i-line stepper at an exposure dose of about 70 mJ/cm². Development with 0.12N TMAH for 60 sec, followed by a DI water rinse gave excellent quality sub-half micron line and space features in the imaging resist layer. There was no detectable decrease in unexposed resist film thickness under these process conditions. SEM micrographs showed smooth side wall profile with no evidence of standing waves or edge roughness. The imaging resist patterns were transferred into the underlayer by magnetically enhanced $O_2$ RIE in an AME5000 tool using 300 to 400 watts of RF power and 5 to 15 mtorr pressure for about 2 min. SEM micrographs of sectioned wafers showed 0.25 and 0.35 μm residue-free features having vertical wall profiles with no image bias or line width variation.

EXAMPLE 12

The following illustrates a typical bilayer lithographic process using a DUV exposure source. The bilayer structure comprising a 1.1 μm thick hard baked novolak underlayer and a 0.3 μm thick silicon resist was formed on a silicon wafer as described in example 10. The resist was imagewise exposed to about 20 mJ/cm² of DUV radiation on a 0.45 NA excimer laser stepper, then developed with 0.18N TMAH for 60 sec followed by a DI water rinse. After drying at elevated temperature, the resist pattern was transferred into the underlayer by $O_2$ RIE as described in examples 10 and 11. SEM examination of the etched patterns showed residue-free 0.2 μm equal line and space features having vertical wall profiles with no change in the original line width.

We claim:

1. A method for producing a photoresist relief image having at least two layers and having sub-half micron features comprising the steps of:
   (a) applying, to a substrate, a polymer underlayer having a refractive index in the range of about 1.58 to 1.7 at the wavelength of the exposing ultra violet radiation; and
   (b) overcoating said polymer underlayer with a composition comprising a photosensitive hydroxyaromatic silsesquioxane polymer partially esterified with diazonaphthoquinone groups having the formula

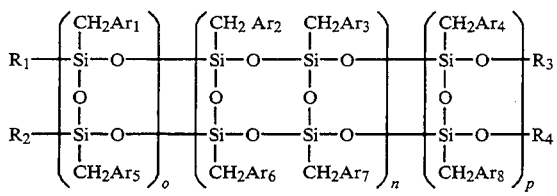

wherein
(1) $R_1$ to $R_4$ are each individually H or $Si(CH_3)_3$; and
(2) each individual $Ar_1$ to $Ar_8$ group is selected from the group consisting of p-hydroxyphenyl, p-methoxyphenyl and p-(2-diazo-1-naphthoquinonesulfonyloxy)phenyl, as represented respectively by the formulas

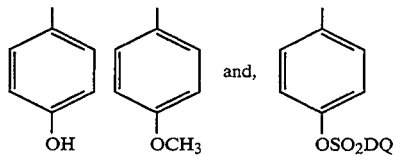

so that the molar ratio in said polymer of p-hydroxyphenyl groups to p-methoxyphenyl groups to p(2-diazo-1-naphthoquinonesulfonyloxy)phenyl groups is in the range from 67:25:8 to 58:30:12, (3) DQ is a 2-diazo-1-naphthoquinone-4 residue, a 2-diazo-1-naphthoquinone-5 residue as represented respectively by the formulas

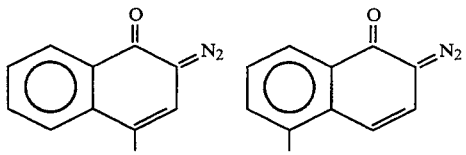

or mixtures thereof; and
(4) n is an integer from 5 to 9; and
(5) o and p are, independently, 0 or 1; and
(c) imagewise exposing the photosensitive silsesquioxane polymer to ultraviolet radiation to form a latent image; and
(d) developing the latent image to form a relief image in the silsesquioxane polymer; and
(e) transferring the relief image to the polymer underlayer with $0_2$ RIE.

2. The method of claim 1 wherein the polymer underlayer has an optical density of at least 1/μm at 365 nm.

3. The method of claim 1 wherein the polymer underlayer has a refractive index in the range of about 1.58 to 1.62.

4. The method of claim 1 wherein the substrate is selected from the group consisting of silicon, silicon oxide, silicon nitride, and galium arsenide.

5. The method of claim 1 wherein the polymer has a thickness of not more than about 2 μm.

6. The method of claim 1 wherein the photosensitive silsesquioxane polymer is applied from a propylene glycol monomethylether acetate solution having 5 to 9, and o and p are, independently, 0 or 1.

7. The method of claim 1 wherein the photosensitive silsesquioxane polymer is imagewise exposed with mid or deep UV radiation.

8. The method of claim 1 wherein the polymer underlayer is selected from the group consisting of hard baked novolak polymers and polyimides.

9. The method of claim 8 wherein the polymer underlayer is a polyimide formed by spin coating a polyamic acid or polyamic ester polyimide precursor onto the substrate followed by baking.

10. The method of claim 8 wherein the polymer underlayer is a polyimide having an azobenzene (Ar—N=N—Ar) chromophore as a part of the polymer chain.

11. The method of claim 8 wherein the polymer underlayer is a polyimide selected from the group consisting of

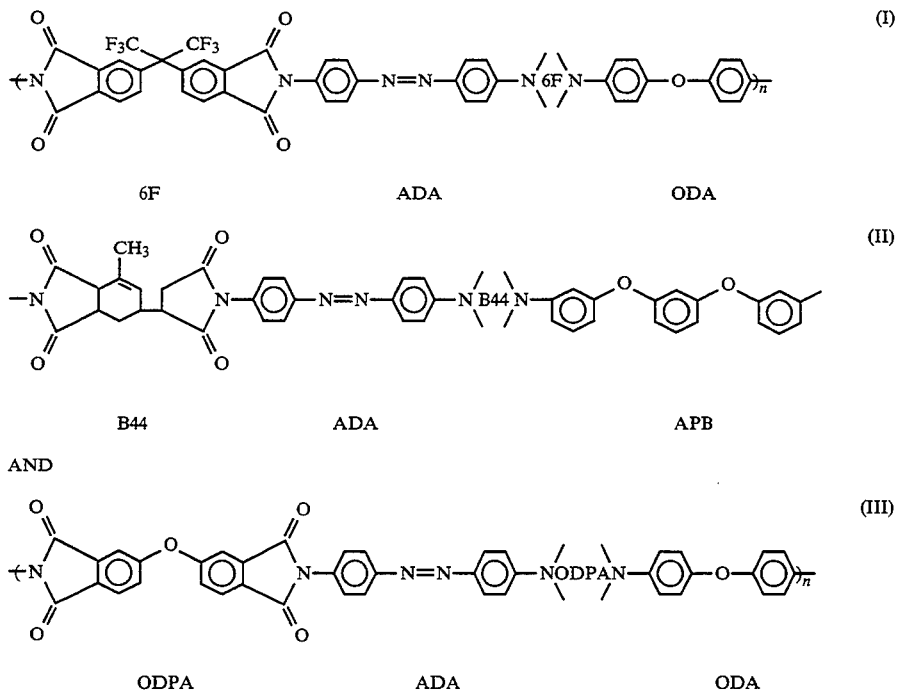

AND